United States Patent
Chang et al.

(10) Patent No.: US 11,721,378 B2
(45) Date of Patent: Aug. 8, 2023

(54) OXIDE SEMICONDUCTOR-BASED FRAM

(71) Applicant: Powerchip Semiconductor Manufacturing Corporation, Hsinchu (TW)

(72) Inventors: Shou-Zen Chang, Hsinchu (TW); Ming-Han Liao, Hsinchu (TW); Min-Cheng Chen, Hsinchu County (TW); Hiroshi Yoshida, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 18/103,500

(22) Filed: Jan. 31, 2023

(65) Prior Publication Data
US 2023/0178134 A1 Jun. 8, 2023

Related U.S. Application Data

(62) Division of application No. 17/486,871, filed on Sep. 27, 2021, now Pat. No. 11,610,621.

(30) Foreign Application Priority Data

Sep. 9, 2021 (TW) ................................. 110133488

(51) Int. Cl.
*G11C 11/22* (2006.01)
*H10B 53/30* (2023.01)

(52) U.S. Cl.
CPC ...... *G11C 11/2275* (2013.01); *G11C 11/2255* (2013.01); *G11C 11/2257* (2013.01); *G11C 11/2273* (2013.01); *H10B 53/30* (2023.02)

(58) Field of Classification Search
CPC ............ G11C 11/2275; G11C 11/2255; G11C 11/2273
See application file for complete search history.

(56) References Cited

U.S. PATENT DOCUMENTS

| 10,102,898 | B2 * | 10/2018 | Li | G11C 11/223 |
| 2007/0126042 | A1 | 6/2007 | Kijima | |
| 2011/0299318 | A1 | 12/2011 | Kaneko | |
| 2014/0340608 | A1 | 11/2014 | Yamazaki | |
| 2021/0408013 | A1 * | 12/2021 | Young | G11C 11/161 |

FOREIGN PATENT DOCUMENTS

| CN | 102265392 A | 11/2011 |
| CN | 107305897 A | 10/2017 |
| TW | 202107464 A | 2/2021 |

* cited by examiner

*Primary Examiner* — Han Yang
(74) *Attorney, Agent, or Firm* — Winston Hsu

(57) ABSTRACT

An oxide semiconductor-based FRAM is provided in the present invention, including a substrate, a word line on the substrate, a gate insulating layer on the word line, an oxide semiconductor layer on the gate insulating layer, a source and a drain respectively on the oxide semiconductor layer and spaced apart at a distance, wherein the source and the drain further connect respectively to a plate line and a bit line, a ferroelectric dielectric layer on the source, the drain and the oxide semiconductor layer, and a write electrode on the ferroelectric dielectric layer, wherein the write electrode, the ferroelectric dielectric layer, the oxide semiconductor layer, the gate insulating layer and the word line overlap each other in a direction vertical to the substrate.

6 Claims, 3 Drawing Sheets

| | BL | WL | PL | WE |
|---|---|---|---|---|
| Read | $V_R$ | $V_{CC}$ | 0 | $V_{CC}$ |
| Write "1" | X | X | 0 or $-V_B/2$ | $+V_B$ or $+V_B/2$ |
| Write "0" | X | X | 0 or $+V_B/2$ | $-V_B$ or $-V_B/2$ |

OXIDE SEMICONDUCTOR-BASED FRAM

CROSS REFERENCE TO RELATED APPLICATIONS

This application is a division of U.S. application Ser. No. 17/486,871, filed on Sep. 27, 2021. The content of the application is incorporated herein by reference.

BACKGROUND OF THE INVENTION

1. Field of the Invention

The present invention relates to a ferroelectric random access memory (FRAM), and more specifically, to an oxide semiconductor-based FRAM.

2. Description of the Prior Art

In memory storage technology nowadays, conventional Flash memory is not suitable for frequent memory write applications due to its limited lifetime number of writes, and SRAM is not applicable for increasing storage capacity and size scaling due to required large layout area. Accordingly, ferroelectric random access memory (FRAM) serves as a type of random access memory provided with aforementioned advantages of small layout area and read/write endurance. Theoretically, FRAM integrates the advantages of non-volatile data storage in read-only memory (ROM) and unlimited high-speed write/read and low power consumption in RAM, make it a candidate of emerging memory type in next generation.

Currently, conventional FRAM is usually designed in FeFET and FeRAM structures. The structure of FeFET is similar to NAND Flash, with the floating gate in NAND Flash replaced with ferroelectric material and integrated in its gate dielectric layer. The FeFET itself is a field effect transistor, thus it can be made into permanent memory or transistors, and since it has structures similar to NAND Flash, FeRAM can be made into 3D architecture with very high storage density. The structure of FeRAM is similar to DRAM, with a transistor serially connected with a capacitor (1T1C architecture) to constitute a memory cell, while the dielectrics in the capacitor is replaced with ferroelectric material.

Since the aforementioned ferroelectric memory is designed to integrate the ferroelectric dielectrics into the gate dielectrics or to serially connect with the source of transistor, the write operation of the memory is through a bit line connected with drain terminal or word line connected with gate terminal to apply a voltage far above the level of supply voltage $V_{CC}$ in order to complete the write action. This operation design is liable to damage the transistor device. Accordingly, those skilled in the art still need to improve the architecture of current FRAM in order to overcome aforementioned disadvantages.

SUMMARY OF THE INVENTION

In light of the aforementioned disadvantage in conventional skills, the present invention hereby provides a novel oxide semiconductor based FRAM structure, featuring the capacitor of FRAM formed right under the channel of oxide semiconductor field effect transistor (OSFET), thereby reducing overall layout area required by the memory. In addition, a write electrode is added right under the capacitor to control the write operation of the FRAM, so as to solve the issue of excessive write voltage damaging transistor devices because the write voltage is applied only through bit lines or word lines.

One aspect of present invention is to provide an oxide semiconductor-based FRAM, including a substrate, a write electrode on the substrate, a ferroelectric dielectric layer on the write electrode, an oxide semiconductor layer on the ferroelectric dielectric layer, a source and a drain respectively on the oxide semiconductor layer and spaced apart at a distance, wherein the source and said drain further connect respectively to a plate line and a bit line, a gate insulating layer on the source, the drain and the oxide semiconductor layer, and a word line on the gate insulating layer, wherein the word line, the oxide semiconductor layer, the ferroelectric dielectric layer and the write electrode overlap each other in a direction vertical to the substrate.

Another aspect of present invention is to provide an oxide semiconductor-based FRAM, including a substrate, a word line on the substrate, a gate insulating layer on the word line, an oxide semiconductor layer on the gate insulating layer, a source and a drain respectively on the oxide semiconductor layer and spaced apart at a distance, wherein the source and the drain further connect respectively to a plate line and a bit line, a ferroelectric dielectric layer on the source, the drain and the oxide semiconductor layer, and a write electrode on the ferroelectric dielectric layer, wherein the write electrode, the ferroelectric dielectric layer, the oxide semiconductor layer, the gate insulating layer and the word line overlap each other in a direction vertical to the substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figures 1, 2:
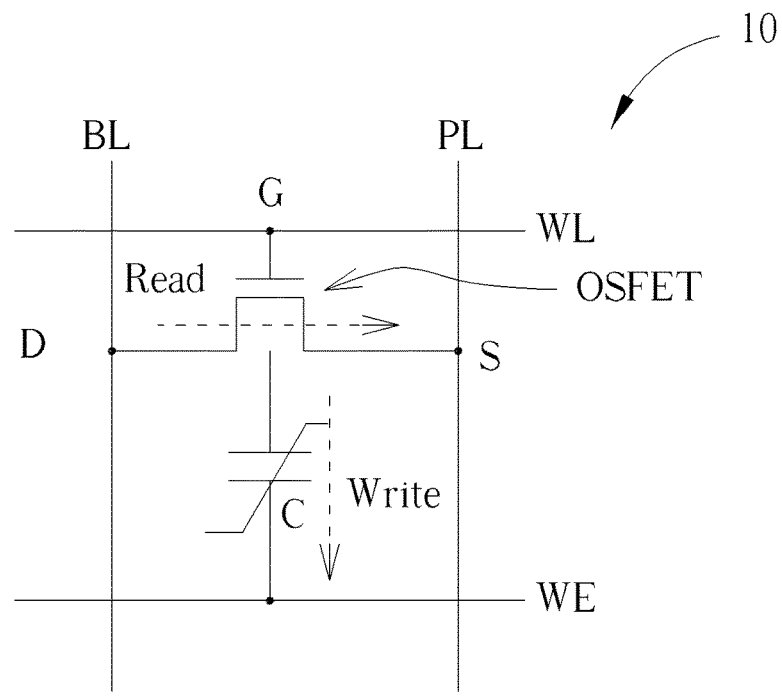
FIG. 1 is a circuit diagram of an oxide semiconductor based FRAM in accordance with one embodiment of the present invention.
FIG. 2 is a voltage list of every node in read and write operations of the oxide semiconductor based FRAM in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Please refer first to FIG. 1, which is a circuit diagram of an oxide semiconductor based FRAM in accordance with one embodiment of the present invention. The FRAM 10 of present invention includes two main parts of an oxide semiconductor field effect transistor OSFET and a capacitor C (in 1T1C architecture). As shown in FIG. 1, the oxide semiconductor field effect transistor OSFET consists of a gate G, a source S and a drain D. In the preferred embodiment of present invention, gate G itself is a word line WL, or may be connected with a word line WL. Source S and drain D are at two sides of the gate G and connected respectively to a plate line PL and a bit line BL. In another aspect, a ferroelectric capacitor C is set below the oxide semiconductor field effect transistor OSFET. One end of the capacitor C is connected with the oxide semiconductor field effect transistor OSFET, while the other end is connected to a write electrode.

Please now refer collectively to FIG. 2, which is a voltage list of every node in read and write operations of the oxide semiconductor based FRAM in accordance with one embodiment of the present invention. According to the circuit diagram shown in aforementioned FIG. 1, in the read operation, a read voltage $V_R$ is applied from a bit line BL and through the channel of oxide semiconductor field effect transistor OSFET to source S, so as to read the storage state of capacitor C. A supply voltage $V_{CC}$ is applied through the word line WL (i.e. gate G) to open gate G so that read voltage $V_R$ may pass through the channel connected with capacitor C, and the supply voltage $V_{CC}$ is also applied through write electrode WE to adjust the threshold voltage of the channel. In this way, the instant logic state of capacitor C such as "0" or "1" may be determined by reading the value of read voltage $V_R$ passing through the channel.

On the other hand, the write operation of memory is generally divide into writing "0" state and writing "1" state. In the write operation of "1" state, bit line BL and word line WL are not applied with voltage and transistor device is in OFF state, while write electrode WE is applied with a write voltage to perform the write action to the ferroelectric capacitor C. One feature of the present invention is that the voltage required in the write action may be divided through the plate line PL. For example, in the case that the voltage of plate line PL is 0V, if the write voltage required by the transistor device is 10V, the write electrode WE should be applied with 10V in order to achieve the write operation. Given that excessive voltage is likely to damage devices, it can be modified to applied −5V and +5V bias voltages respectively at the plate line PL and the write electrode WE, so as to achieve 10V potential difference at capacitor C to achieve the write action. The aforementioned voltage dividing design through write electrode WE and plate line PL may divide the required write voltage into $+V_B/2$ and $-V_B/2$ applied from different nodes so as to decrease required bias voltages. Similarly, in the write operation of "0" state contrary to the "1" state, bias voltage $+V_B/2$ and $-V_B/2$ are applied respectively to the plate line PL and the write electrode WE to achieve the write operation of reverse storage state.

It can be understood from the aforementioned operations that the device design of present invention may provide different paths for the read operation and write operation of the memory. Conventional skill usually adopts the design of serially connecting the ferroelectric capacitor with the source of transistor or integrating the ferroelectric dielectrics into the gate dielectrics. Although these conventional designs don't need to set up additional write electrode like the present invention, they must apply a voltage far above the level of supply voltage $V_{CC}$ through bit line or word line in order to achieve the write operation, which is likely to damage the transistor device. The present invention provides the approach of connecting two terminals of the ferroelectric capacitor respectively with the transistor channel and the additional write electrode without increasing the layout area of unit cell, so that the read and write paths of the memory may be divided and the write action of the memory is not through the bit line or the word line, and the required voltage may be additionally divided through the write electrode WE and the plate line PL, so that it is less likely to damage the oxide semiconductor field effect transistor OSFET.

Figure 3:
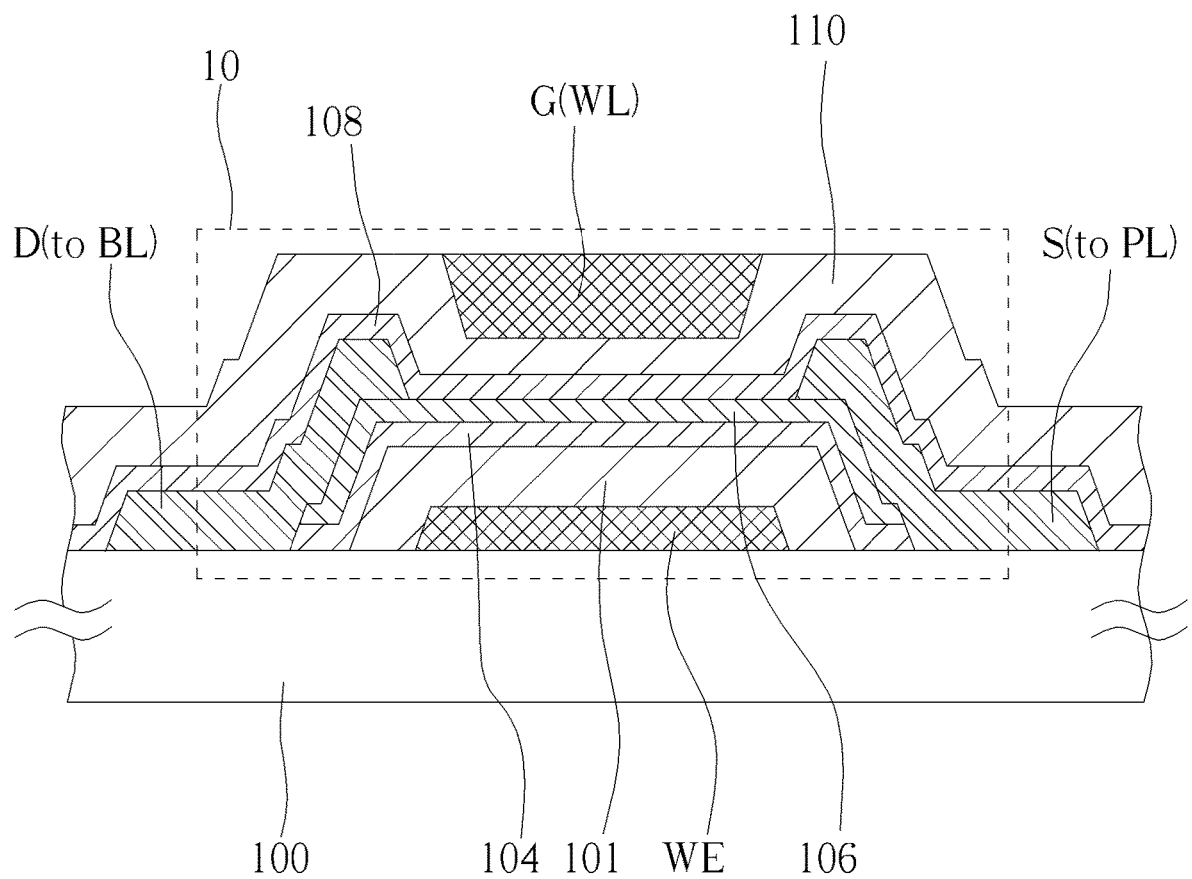
FIG. 3 is a cross-section of the oxide semiconductor based FRAM in accordance with one embodiment of the present invention.

Please refer now to FIG. 3, which is a cross-section of the oxide semiconductor based FRAM in accordance with one embodiment of the present invention. The structural composition of FRAM of the present invention in the direction vertical to the substrate may be understood through this cross-section. As shown in FIG. 3, the FRAM 10 of present invention includes a substrate 100, which functions as a structural base for entire FRAM device. The substrate 100 may be any component with carrier function, for example a semiconductor substrate including silicon-based substrate, silicon-on-insulator (SOI) substrate, sapphire substrate, but not limited thereto. The surface of substrate 100 includes an insulating layer (not shown). The material of the insulating layer may be a nitrogen-containing silicon-based layer, such as silicon nitride or silicon oxynitride. A write electrode WE is formed on the surface of substrate 100, for example, setting on the aforementioned insulating layer. The write electrode WE may be an electrically conductive layer, such as a metal layer with materials like Cu, Al, Mo, Cr, Ti and/or Ta. Alternatively, the material may be nitrides of aforementioned metal elements, such as titanium nitride, molybdenum nitride or tungsten nitride. Still alternatively, the material may be conductive metal oxide, such as indium oxide ($In_2O_3$), tin oxide ($SnO_2$), zinc oxide (ZnO), indium oxide-tin oxide ($In_2O_3$—$SnO_2$) or indium oxide-zinc oxide ($In_2O_3$—ZnO). In other embodiment, write electrode WE may be parts of metal interconnects that is integrated in semiconductor BEOL process. A ferroelectric dielectric layer 101 is formed over the surface of write electrode WE and directly contacting therewith. In the embodiment of present invention, the ferroelectric dielectric layer 101 is the storage component of FRAM 10, with storage state like "0" or "1" capable of being modified by applying voltages in order to achieve storage function. The material of ferroelectric dielectric layer 101 may be ferroelectric material such as lead zirconate titanate (PZT), hafnium zirconium oxide (HZO), barium titanate ($BaTiO_3$), lead titanate ($PbTiO_3$) and hafnium oxide ($HfO_2$) doped with elements like N, Si, AL, Y and/or Sr.

Refer still to FIG. 3. A first oxide semiconductor layer 104 and a second oxide semiconductor layer 106 are sequentially formed over the surface of ferroelectric dielectric layer 101. In the embodiment of present invention, the first oxide semiconductor layer 104 and the second oxide semiconductor layer 106 functions as a channel of oxide semiconductor field effect transistor OSFET and consist of oxide semiconductor materials like gallium oxide ($GaO_x$), gallium zinc oxide ($Ga_2Zn_xO_y$) or indium gallium zinc oxide (IGZO), especially the C-axis aligned crystalline IGZO (CAAC-IGZO) with high carrier mobility and low leakage current. The first oxide semiconductor layer 104 and the second oxide semiconductor layer 106 may have the same or similar elements but with different compositions. For example, the first oxide semiconductor layer 104 and the second oxide semiconductor layer 106 may be made of IGZO, but the atomic ratio of In/Ga/Zn in second oxide semiconductor layer 106 may be 1:1:1 or 3:1:2, while the atomic ratio of In/Ga/Zn in first oxide semiconductor layer 104 is 1:3:1. That is, the first oxide semiconductor layer 104 is provided with higher Ga content and lower In content. Since the band gap of oxide semiconductor may be controlled by adjusting the ratio of In and Ga, the first oxide semiconductor layer 104 and the second oxide semiconductor layer 106 with same elements but different compositions may stabilize the interface and reduce the possibility of charged being trapped at the interface, thereby preventing the deterioration of transistor and increase reliability. In some embodiments, the crystallinity of first oxide semiconductor layer 104 is lower than the one of second oxide semiconductor layer 106. While in some embodiments, the first oxide semiconductor layer 104 and the second oxide semiconductor layer 106 may be considered as a single oxide semiconductor layer with the same elements, composition and crystallinity.

In the preferred embodiment of present invention, the aforementioned write electrode WE, ferroelectric dielectric layer 101, first oxide semiconductor layer 104 and second oxide semiconductor layer 106 are sequentially aligned and stacked and directly contact each other, and may be patterned into islands through etching process, wherein the first oxide semiconductor layer 104 and the second oxide semiconductor layer 106, the ferroelectric dielectric layer 101 and the write electrode WE constitute a ferroelectric capacitor with a structure like metal-insulator-metal (MIM). The ferroelectric capacitor functions as a storage component of the FRAM 10 to achieve the read operation through the oxide semiconductor field effect transistor right above it, and to achieve the write operation through the potential difference between a top electrode (i.e. first and second oxide semiconductor layers 104, 106) and a bottom electrode (i.e. write electrode WE). In other embodiment, two sides of the ferroelectric dielectric layer 101 may be formed additionally with electrode plates to connect respectively with the write electrode WE or the first and second oxide semiconductor layers 104, 106, but not limited thereto. In the present invention, since the ferroelectric capacitor is designed to be set right below the oxide semiconductor field effect transistor. In comparison to conventional skills, the design of present invention may reduce required layout area for entire memory and is applicable in monolithic 3D (M3D) technology.

Refer still to FIG. 3. In FRAM 10, a source S and a drain D are formed respectively on the second oxide semiconductor layer 106 and are spaced apart from each other at a distance. The source S and drain D contact directly with the first oxide semiconductor layer 104 and the second oxide semiconductor layer 106 and extend onto the substrate 100 at two sides. In the embodiment, the source S and drain D partially overlap parts of the first oxide semiconductor layer 104, second oxide semiconductor layer 106 and ferroelectric dielectric layer 101, but not overlap the write electrode WE. Furthermore, the source S and drain D are symmetrical with respect to the write electrode WE, and a part of the second oxide semiconductor layer 106 is exposed from a trench between the source S and drain D. The material of source S and drain D is the same as the one of write electrode WE, such as metal materials like Cu, Al, Mo, Cr, Ti and/or Ta. Alternatively, the material may be nitrides of aforementioned metal elements, such as titanium nitride, molybdenum nitride or tungsten nitride. Still alternatively, the material may be conductive metal oxide, such as indium oxide ($In_2O_3$), tin oxide ($SnO_2$), zinc oxide (ZnO), indium oxide-tin oxide ($In_2O_3$—$SnO_2$) or indium oxide-zinc oxide ($In_2O_3$—ZnO). In the embodiment, the source S and drain D may be connected respectively and upwardly to a plate line PL and a bit line BL (not shown) in order to receive/transmit signals or voltages from those components to achieve the read operation or write operation of the memory.

Refer still to FIG. 3. A gate insulating layer 108 is formed on the source S and drain D, and more specifically, conformally formed over the source 5, drain D and exposed second oxide semiconductor layer 106. The material of gate insulating layer 108 may be silicon oxide, silicon nitride, silicon oxynitride or high-k material like hafnium oxide. In some embodiments, the gate insulating layer 108 preferably includes parts of the metal elements in the second oxide semiconductor layer 106, such as Al, Ga or Zn, in order to reduce charge trapping at the interface and prevent the formation of parasite channel. Besides, in the embodiment, a thick protection layer 110 may be formed above the gate insulating layer 108 with a material the same as the one of gate insulating layer 108, including silicon oxide, silicon nitride, silicon oxynitride, aluminum oxide, gallium oxide or gallium zinc oxide. A gate G is formed on a position of the protection layer 110 corresponding to the write electrode WE below. The gate G, protection layer 110, gate insulating layer 108, source S and drain D, and the first and second oxide semiconductor layers 104, 106 constitute an oxide semiconductor field effect transistor. In the preferred embodiment of present invention, gate G is a word line WL of the FRAM 10, which may receive the supply voltage to control the switch of the oxide semiconductor field effect transistor. The material of gate G may be the same as the one of write electrode WE, such as metal materials like Cu, Al, Mo, Cr, Ti and/or Ta. Alternatively, the material may be nitrides of aforementioned metal elements, such as titanium nitride, molybdenum nitride or tungsten nitride. Still alternatively, the material may be conductive metal oxide, such as indium oxide ($In_2O_3$), tin oxide ($SnO_2$), zinc oxide (ZnO), indium oxide-tin oxide ($In_2O_3$—$SnO_2$) or indium oxide-zinc oxide ($In_2O_3$—ZnO). In other embodiment, gate G may be connected upwardly to a word line.

Figure 4:
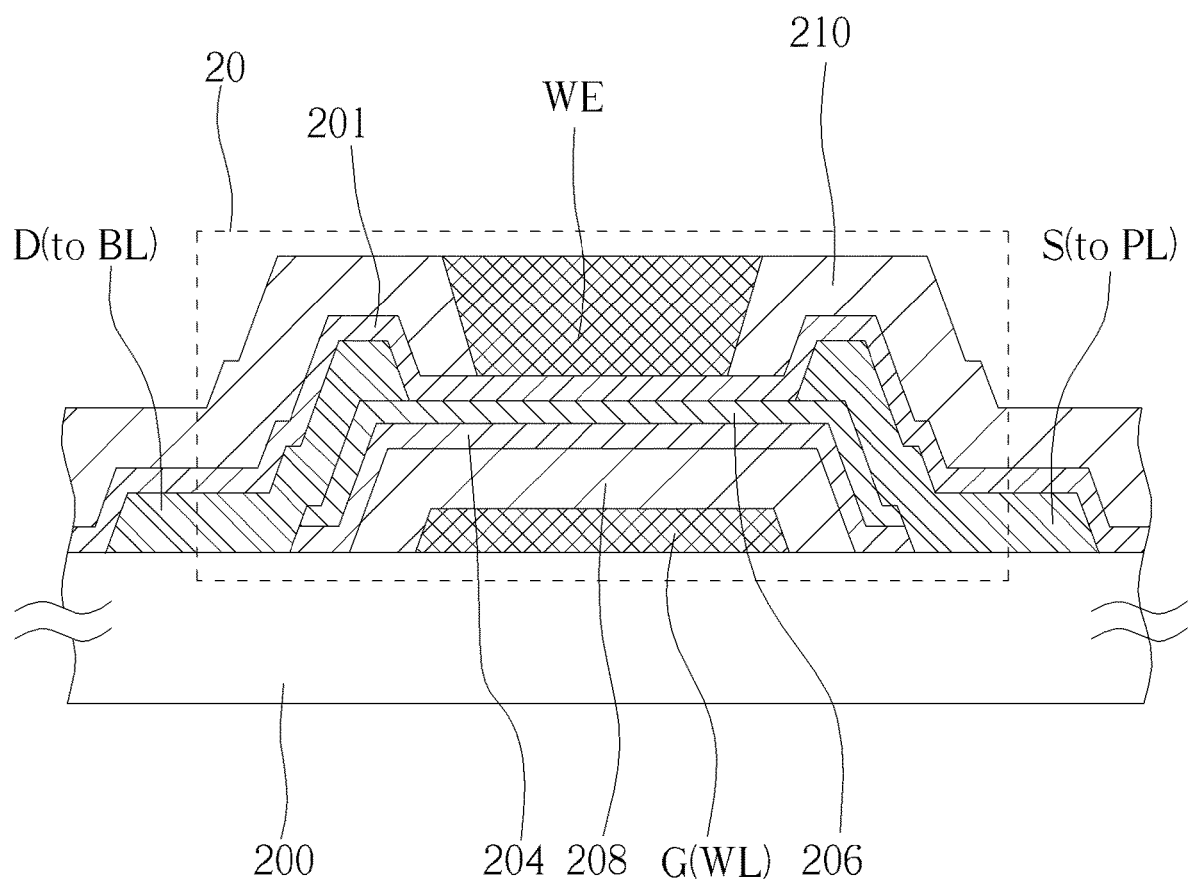
FIG. 4 is a cross-section of the oxide semiconductor based FRAM in accordance with another embodiment of the present invention.

Please refer to FIG. 4, which is a cross-section of the oxide semiconductor based FRAM in accordance with another embodiment of the present invention. The structures and components in this embodiment are roughly the same as the ones in the aforementioned embodiment shown in FIG. 3 except the set-up and arrangement therebetween. In this embodiment, the write electrode WE is designedly set on the oxide semiconductor field effect transistor, while the gate G of the oxide semiconductor field effect transistor is set below the ferroelectric capacitor.

As shown in FIG. 4, the FRAM 20 of present invention includes a substrate 200, which functions as a structural base for entire FRAM device. A gate G is formed on the surface of substrate 200. In this embodiment, the gate G is the word line WL of FRAM 20, which may receive the supply voltage to control the switch of the oxide semiconductor field effect transistor. A gate insulating layer 208 is formed conformally over the gate G. A first oxide semiconductor layer 204 and a second oxide semiconductor layer 206 are formed sequentially on the surface of gate insulating layer 208. In this embodiment, the first oxide semiconductor layer 204 and the second oxide semiconductor layer 206 functions as a channel of oxide semiconductor field effect transistor. The aforementioned gate G, gate insulating layer 208, first oxide semiconductor layer 204 and second oxide semiconductor layer 206 are sequentially aligned and stacked and directly contact each other, and may be patterned into islands through etching process. In FRAM 20, a source S and a drain D are formed respectively on the second oxide semiconductor layer 206 and are spaced apart from each other at a distance. The source S and drain D contact directly with the first oxide semiconductor layer 204 and the second oxide semiconductor layer 206 and extend onto the substrate 200 at two sides. In the embodiment, the source S and drain D partially overlap parts of the first oxide semiconductor layer 204, second oxide semiconductor layer 206 and gate insulating layer 208, but not overlap the gate G. Furthermore, the source S and drain D are symmetrical with respect to the gate G, and a part of the second oxide semiconductor layer 206 is exposed from a trench between the source S and drain D. The gate G, gate insulating layer 208, source S and drain D, and first and second oxide semiconductor layers 204, 206 constitute an oxide semiconductor field effect transistor.

Refer still to FIG. 4. A ferroelectric dielectric layer 201 and a protection layer 210 are formed sequentially on the source S and drain D, and more specifically, formed conformally over the source S, drain D and exposed second oxide semiconductor layer 206. The ferroelectric dielectric layer 201 is the storage component of FRAM 20, with storage state like "0" or "1" capable of being modified by applying voltages in order to achieve storage function. A write electrode WE is formed on a position of the protection layer 210 corresponding to the gate G below, and the protection layer 210 is between the ferroelectric dielectric layer 201 and the write electrode WE. In this embodiment, a part of the write electrode WE passes through the protection layer 210 to contact with the ferroelectric dielectric layer 201 below, wherein the first oxide semiconductor layer 204 and the second oxide semiconductor layer 206, the ferroelectric dielectric layer 201 and the write electrode WE constitute a ferroelectric capacitor with a structure like metal-insulator-metal (MIM). The ferroelectric capacitor functions as a storage component of the FRAM 20 to achieve the read operation through the oxide semiconductor field effect transistor right under it, and to achieve the write operation through the potential difference between a top electrode (i.e. write electrode WE) and a bottom electrode (i.e. first and second oxide semiconductor layers 204, 206). The materials of components and operation principles in aforementioned embodiment are the same as the ones in the embodiment of FIG. 3. No more unnecessary details will be repeated herein.

In conclusion to the aforementioned embodiments, it can be understood that the FRAM of present invention includes an oxide semiconductor field effect transistor and a ferroelectric capacitor set above or below the oxide semiconductor field effect transistor, with features of reading data stored in the ferroelectric capacitor through the oxide semiconductor field effect transistor and performing write actions to the FRAM through a write electrode of the ferroelectric capacitor. In comparison to conventional skills, the advantage of present invention is that required layout area for devices may be significantly reduced and it is applicable in monolithic 3D technology. In addition, the write electrode may relieve the voltage loading of the transistor devices and reduce the risk of device deteriorations or damages.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An oxide semiconductor-based FRAM, comprising:
   a substrate;

a word line on said substrate;
a gate insulating layer on said word line;
an oxide semiconductor layer on said gate insulating layer;
a source and a drain respectively on said oxide semiconductor layer and spaced apart at a distance, wherein said source and said drain further connect respectively to a plate line and a bit line;
a ferroelectric dielectric layer on said source, said drain and said oxide semiconductor layer; and
a write electrode on said ferroelectric dielectric layer, wherein said write electrode, said ferroelectric dielectric layer, said oxide semiconductor layer, said gate insulating layer and said word line overlap each other in a direction vertical to said substrate, wherein said write electrode, said ferroelectric dielectric layer and said oxide semiconductor layer constitute a ferroelectric capacitor, wherein a bias voltage and a reverse bias voltage are respectively applied on said write electrode and said plate line to write data in said ferroelectric capacitor.

2. The oxide semiconductor-based FRAM of claim 1, further comprising a protection layer between said ferroelectric dielectric layer and said write electrode, and part of said write electrode passes through said protection layer to contact with said ferroelectric dielectric layer.

3. The oxide semiconductor-based FRAM of claim 1, wherein said source and said drain are not overlapped said write electrode in said direction vertical to said substrate.

4. The oxide semiconductor-based FRAM of claim 1, wherein a surface of said substrate comprises an insulating layer, and said word line is on said insulating layer.

5. The oxide semiconductor-based FRAM of claim 1, wherein in a read operation, said bit line applies a read voltage to read data stored in said ferroelectric dielectric layer.

6. The oxide semiconductor-based FRAM of claim 5, wherein in a read operation, said word line applies a supply voltage to open a channel in said oxide semiconductor layer, and said write electrode applies said supply voltage to adjust a threshold voltage of said channel.

* * * * *